United States Patent [19]
Nakamura et al.

[11] Patent Number: 5,514,877
[45] Date of Patent: May 7, 1996

[54] SUPERCONDUCTING DEVICE AND A METHOD FOR MANUFACTURING THE SAME

[75] Inventors: Takao Nakamura; Hiroshi Inada; Michitomo Iiyama, all of Osaka, Japan

[73] Assignee: Sumitomo Electric Industries, Ltd., Osaka, Japan

[21] Appl. No.: 183,894

[22] Filed: Jan. 21, 1994

Related U.S. Application Data

[63] Continuation of Ser. No. 766,185, Sep. 27, 1991, abandoned.

[30] Foreign Application Priority Data

| Sep. 27, 1990 | [JP] | Japan | 2-257851 |
| Sep. 27, 1990 | [JP] | Japan | 2-257852 |
| Sep. 27, 1990 | [JP] | Japan | 2-257856 |
| Sep. 27, 1990 | [JP] | Japan | 2-257858 |
| Nov. 1, 1990 | [JP] | Japan | 2-295658 |

[51] Int. Cl.$^6$ ............ H01L 29/06; H01B 12/00; B05D 5/12
[52] U.S. Cl. ............ 257/34; 257/35; 257/39; 505/190; 505/193; 505/238; 427/62; 427/63
[58] Field of Search ............ 357/5; 505/1, 700–703, 505/190, 193, 233, 234, 238; 427/62, 63; 257/34, 35, 39

[56] References Cited

U.S. PATENT DOCUMENTS

| 4,751,563 | 6/1988 | Labowitz et al. | 357/5 |
| 4,878,094 | 10/1991 | Balkanski | 357/5 |
| 5,026,682 | 6/1991 | Clark et al. | 505/1 |
| 5,096,882 | 3/1992 | Kato et al. | 505/725 |

FOREIGN PATENT DOCUMENTS

| 0280308 | 8/1988 | European Pat. Off. | |
| 364101 | 4/1990 | European Pat. Off. | 357/5 |
| 63-283176 | 11/1988 | Japan | 257/35 |
| 1133381 | 5/1989 | Japan | 357/5 |
| 1183175 | 7/1989 | Japan | 357/5 |
| 1235284 | 9/1989 | Japan | 357/5 |
| 1235283 | 9/1989 | Japan | 357/5 |
| 1257380 | 10/1989 | Japan | 357/5 |

OTHER PUBLICATIONS

Rothschild et al, "Laser Patterning of Metal Oxide Superconductor Films by Reactive Solid–State Transformation", IEEE Electron Device Letters, vol. 9, #2, Feb. 1988, pp. 68–70.

Dijkkamp et al, "Preparation of Y–Ba–Cu–O Superconductor Thin Films Using Pulsed Laser Evaporation from Hi–Tc Bulk Material," App. Phys. Lett., vol. 51, #8, 24 Aug. 1987, pp. 619–621.

Clark et al, "Effects of Radiation Damage in Ion–Implanted Thin Films of Metal–Oxide Superconductors", Appl. Phys. Lett., vol. 51, #2, 13 Jul. 1987.

Yoshida et al, "Monolithic Device Fabrication Using High–Tc Superconductor", IEDM 88, pp. 282–285.

*Primary Examiner*—Mahshid Saadat
*Attorney, Agent, or Firm*—Beveridge, DeGrandi, Weilacher & Young

[57] ABSTRACT

A superconducting device or a super-FET has a pair of superconducting electrode regions (20b,20c) consisting of a thin film (20)oxide superconductor being deposited on a substrate (5) and a weak link region (20a), the superconducting electrode regions (20b, 20c) being positioned at opposite sides of the weak link region (20a) these superconducting electrode regions (20b, 20c) and the weak link region (20a) being formed on a common plane surface of the substrate (5). The weak link region (20a) is produced by local diffusion of constituent element(s) of the substrate (5) into the thin film (20) of the oxide superconductor in such a manner that a substantial wall thickness of the thin film (20) of the oxide superconductor is reduced at the weak link region (20a) so as to leave a weak link or superconducting channel (10) in the thin film (20) of oxide superconductor over a non-superconducting region (50) which is produced by the diffusion.

12 Claims, 15 Drawing Sheets

SUPERCONDUCTING DEVICE AND A METHOD FOR MANUFACTURING THE SAME

This application is a continuation of application Ser. No. 07/766,185, filed Sep. 27,1991, now abandoned which application is entirely incorporated herein by reference.

BACKGROUND OF THE INVENTION

1. Field of the Invention

The present invention relates to a superconducting device, more particularly a super-FET having a novel structure having a flat surface and a weak link which is formed locally at a portion of a thin film of oxide superconductor deposited on a substrate, and a method for manufacturing the same.

2. Description of the Related Arts

The conventional superconductors exhibit the superconductive phenomenon only at limited extremely low temperatures so that it has not expected to be used in actual applications. However, new type oxide superconductors of $[La, Ba]_2CuO_4$, $[La,Sr]_2CuO_4$ or the like were discovered in 1986 and then discovery of the other superconducting compound oxides such as Y-Ba-Cu-O system or Bi-Ca-Sr-Cu system was continued. In these newly discovered oxide superconductors, the superconductive phenomenon can be realized with relatively cheaper liquid nitrogen and hence the possibility of actual utilization of the high Tc superconductors have burst onto the scene.

The oxide superconductors were used in a bulk form of sintered block by powder sintering technique. The sintered articles, however, shows very poor critical current density. In order to overcome this problem, a variety of deposition techniques have been studied to prepare thin films of these superconductors.

Josephson device which is a typical superconducting device has a pair of superconducting electrodes connected through a so-called weak link and shows unique properties such as DC Josephson effect which is explained as a tunnel effect of Cooper pairs and AC Josephson effect which is characterized by dispersive voltage/current curve. A planer type Josephson device which can be manufactured from a thin film of oxide superconductor can be classified into two categories of a Dayem bridge (DMB) type and a variable thickness bridge (VTB) type. FIG. 4A and 4B illustrate typical two structures of these two types.

FIG. 4A shows a simplest form of the Dayem bridge (DMB) type Josephson device. This Josephson device has a pair of superconducting electrode zones 21b, 21c each having a sufficient line width which are produced by patterning work on a thin film 21 of oxide superconductor having a sufficiently thick wall-thickness and deposited on a substrate 11 and a weak link zone 21a having an extremely fine line width (w).

FIG. 4B shows a simplest form of the variable thickness bridge (VTB) type Josephson device2 This Josephson device has a pair of superconducting electrode zones 21b, 21c each having a sufficient line thickness which are produced by removing a predetermined portion of a thin film 21 of oxide superconductor and deposited on a substrate 11 and a weak link zone 21a having an extremely thin wall-thickness (t).

In these planer type Josephson devices, the line width (w) or the wall-thickness (t) of the weak link has a close relation to performance of the superconducting devices obtained and hence, in order to obtain a desired characteristics or performance with a good repeatability, a high precision on a sub-micron level of the processing such as the etching is required. In fact, the planer type Josephson devices have following problems:

The Dayem bridge type Josephson device can be said to be more preferable than the variable thickness bridge type Josephson device, since the Dayem bridge type Josephson device has a relatively planer surface, which is preferred in integrated circuits. However, in order to form the weak link in the Dayera bridge type Josephson device, it is required to pattern a thin film of oxide superconductor having a thickness on the order of 0.5 µm to 1.0 µm into a width of not greater than 0.2 µm. However, it is very difficult to conduct such fine patterning with good repeatability. On the other hand, in the variable thickness bridge type Josephson device, the very fine pattering is not required in order to form the weak link. However, it is very difficult to uniformly control the remaining thickness of the thinned portion forming the weak link. In addition, the variable thickness bridge type Josephson device cannot have a satisfactorily planer surface. This is not preferable to the integrated circuit applications.

Superconducting devices having three-terminals such as a superconducting-base transistor, a super-FET (field effect transistor) or the like are also known.

FIG. 5 is an illustrative drawing of a superconducting-base transistor having a layered structure comprising an emitter 121 made of superconductor or ordinary conductor, a tunnel barrier 122 made of insulator, a base 123 made of superconductor, an isolator 124 of semiconductor and a collector 125 made of ordinary conductor arranged in this order. The superconducting-base transistor is a high-speed element of low power consumption in which high-speed electrons pass through the tunnel barrier 122.

FIG. 6 is an illustrative drawing of a super-FET in which a superconducting source electrode 141 and a superconducting drain electrode 142 each made of superconductor are arranged on a semiconductor layer 143 in closed proximity to each other. A portion of the semiconductor layer 143 between the source electrode 141 and the drain electrode 142 is removed at its rear side to form a thin layer on which a gate electrode 144 is deposited through a gate insulator layer 146. In the super-FET, a superconducting current flows through the semiconductor layer portion between the superconductor source electrode 141 and the superconductor drain electrode 142 due to a superconducting proximity effect, and is controlled by an applied gate voltage. This super-FET also functions at a high speed with a low power consumption.

The other type three-terminal superconducting devices are also reported. For example, a known three-terminal superconducting device has a channel of a superconductor formed between a source electrode and a drain electrode so that a current flowing through the superconducting channel is controlled by a voltage applied to a gate formed above the superconducting channel.

The above mentioned superconducting-base transistor and the super-FET have a portion in which a semiconductor layer and a superconducting layer are stacked one over another. However, it is difficult to form such a stacked structure of the semiconductor layer and the superconducting layer formed of an oxide superconductor which has been recently advanced in study. And, even if it is possible to form such a stacked structure of the semiconductor layer and the oxide superconducting layer, it is difficult to prepare a desired interface or boundary between the semiconductor layer and the oxide superconducting layer. Therefore, a satisfactory operation and performance could not been observed in the conventional superconducting devices.

Still more, since the super-FET utilizes the superconducting proximity effect, the superconductor source electrode 141 and the superconductor drain electrode 142 must be located closely to each other at a close distance which is a few times of the coherence length of the superconductor materials of the superconductor source electrode 141 and the superconductor drain electrode 142. In particular, when the superconductor source electrode 141 and the superconductor drain electrode 142 are formed of the oxide superconductor material, a distance between the superconductor source electrode and the superconductor drain electrode has to be not greater than a few ten nanometers because the oxide superconductor has a very short coherence length. However, it is very difficult to conduct a fine processing such as a fine pattern-etching so as to ensure such very short separation distance. Because of this, in the prior art, it has been impossible to manufacture the super-FET composed of the oxide superconductor material.

Although some modulation operation or behavior was confirmed in the conventional three-terminal superconducting device having the superconducting channel, the conventional three-terminal superconducting device having the superconducting channel could not realize a complete ON/OFF operation because of its too high carrier density. The oxide superconductor is a material expected to realize a new three-terminal superconducting device which has a superconducting channel and which can realize a complete ON/OFF operation since the oxide superconductor material has a low carrier density. In this case, however, a thickness of the superconducting channel has to be made on the order of five nanometers.

Therefore, an object of the present invention is to solve the problems of the prior arts and to provide a novel structure of the superconducting device whose upper surface can be flattened easily and which can be manufactured by using existing established processing techniques with a good repeatability and a method for manufacturing the same.

SUMMARY OF THE INVENTION

The present invention provides a superconducting device having a pair of superconducting electrode regions consisting of a thin film oxide superconductor having a sufficiently thick wall-thickness and being deposited on a substrate and a weak link region, the superconducting electrode regions being positioned at opposite sides of the weak link region, both of the superconducting electrode regions and the weak link region being formed on a common plane surface of the substrate, characterized in that the weak link region is produced by local diffusion of a consistent element or elements of which the substrate is made into the thin film of oxide superconductor at a predetermined portion of the thin film of oxide superconductor which corresponds to the weak link region in such a manner that a substantial wall thickness of the thin film of oxide superconductor is reduced at the weak link region so as to leave a weak link or superconducting channel in the thin film of oxide superconductor over a non-superconducting region which is produced by the diffusion.

In a preferred embodiment of the present invention a source electrode and a drain electrode for supplying a superconducting current passing through the superconducting channel are deposited on the thin film of oxide superconductor on respective superconducting electrode regions at opposite sides of the superconducting channel, and a gate electrode for controlling the superconducting current is formed over the superconducting channel. According to the present invention, the electrodes are not necessarily made of superconductor.

In a variation of the present invention, the non-superconducting region is produced by diffusion of a dopant which can diffuse easily into the thin film of oxide superconductor and destroy the superconductivity of the oxide superconductor and which is added onto a surface of the substrate.

The non-superconducting region is formed by diffusion of an element or elements of which the substrate is made. This diffusion is preferably effected by irradiating of a predetermined limited portion of the thin film of oxide superconductor with an energy beam which can be a laser beam or an ion beam. In a variation, the non-superconducting region can be formed or produced by a reaction caused by heating between an element or elements of which the substrate is made and the oxide superconductor.

In another preferred embodiment, an insulating layer is interposed between the gate electrode and the superconducting channel. In this case, it is possible to form another non-superconducting zone between the insulating layer and the superconducting channel by diffusion of an element or elements of which the insulating layer is made. This diffusion of element(s) of the insulating layer can be done by Joule heat.

The present invention provides also a method for manufacturing the above-mentioned superconducting device or super-FET having a pair of superconducting electrode regions consisting of a thin film oxide superconductor having a sufficiently thick wall-thickness and being deposited on a substrate and a weak link region, the superconducting electrode regions being positioned at opposite sides of the weak link region, both of the superconducting electrode regions and the weak link region being formed on a common plane surface of the substrate, characterized by the steps of depositing a thin film of oxide superconductor having a thickness which is sufficient to provide the superconducting electrode regions on the substrate, and diffusing a constituent element or elements of which the substrate is made into the thin film of oxide superconductor to produce a non-superconducting region in the thin film of oxide superconductor in such a manner that a weak link or superconducting channel is left in the thin film of oxide superconductor over the non-superconducting region.

In a preferred embodiment of the present invention, the diffusion of constituent element or elements of the substrate into the thin film of oxide superconductor is effected by irradiation of an energy beam such as a laser beam or an ion beam or by irradiation of heat such as light or Joule heat which impinges onto a predetermined portion of the thin film of oxide superconductor which corresponds to the weak link.

In a variation of the present invention, a portion of the substrate is doped locally with an dopant which can diffuse easily into the thin film of oxide superconductor and destroy the superconductivity of the oxide superconductor before the thin film of oxide superconductor is deposited on the substrate and then the dopant is diffused into the thin film of oxide superconductor so as to form the non-superconducting region.

In a preferred embodiment of the present invention, a source electrode and a drain electrode for supplying a superconducting current passing through the superconducting channel is formed on the thin film of oxide superconductor at respective superconducting electrode regions at opposite sides of the superconducting channel, and also a gate electrode for controlling the superconducting current is formed over the superconducting channel. In an actual manufacturing example, a reflective film is formed on the thin film of oxide superconductor. This reflective film has an opening at a position corresponding to the weak link region so that the diffusion of the constituent element(s) of the substrate caused by a lamp annealing is limited at a portion of the thin film of oxide superconductor while remaining portions are protected by the reflective film.

In practice, an insulating layer and an ordinary conducting layer are deposited successively on the thin film of oxide superconductor. A gate insulating layer and a gate electrode are formed by patterning the insulating layer and the ordinary conducting layer. Then, an electric current is applied to the gate electrode so that the thin film of oxide superconductor is heated locally. During this heating, the elements of substrate and/or the gate insulating layer diffuse into the thin film of oxide superconductor at a heated zone, so that at least one non-superconducting region is formed between the insulating layer and the superconducting: channel and/or between the substrate and the superconducting channel which is delimited by the non-superconducting regions.

In the prior arts, the weak link of the superconducting device is formed by physical processing at a weak link region of a thin film of oxide superconductor which has been deposited previously on a substrate. In order to realize a Josephson device having a desired performance, it is requested to carry out extremely high precision in the physical processing because the line width or line thickness is extremely fine. Contrary to such prior arts, in the case of the superconducting device according to the present invention, such physical processing of extremely high precision which must be carried out in a very limited area is not necessary because the weak link according to the present invention is produced by simple heating the substrate and the thin film of oxide superconductor at a predetermined portion of the thin film of oxide superconductor which corresponds to a weak ink region so that a constituent element or elements of the substrate diffuse thermally into the thin film of oxide superconductor, resulting in that an effective thickness of the thin film of oxide superconductor is reduced in such a manner that a weak link is left in the thin film. Therefore, the superconducting device according to the present invention shows improved controllability and repeatability. Still more, the superconducting device according to the present invention is very suitable for the integrated circuit application because this type superconducting device has a planer surface at the finished condition thereof.

In order to ensure that the superconducting channel can be turned on and off by a voltage applied to the gate electrode, a thickness of the superconducting channel has to be on the order of five nanometers in the direction of an electric field created by the voltage applied to the gate electrode. An essence of the present invention resides in that such an extremely thin superconducting channel can be realized or formed easily.

In an example of the super-FET according to the present invention, a non-superconducting region is formed by diffusion of an element or elements of which the substrate is made into a thin film of oxide superconductor so that a portion of superconductor which is left in the thin film of oxide superconductor functions as the superconducting channel. In other words, a very thin superconducting channel is formed in a portion of the thin film of oxide superconductor over the non-superconducting region. In this case, the diffusion of a consistent element or elements of the substrate into the thin film of oxide superconductor can be effected by local irradiation with a converged ion beam, a laser beam or the like which is directed onto a portion of the thin film of oxide superconductor where the superconducting channel is to be formed so that the consistent element or elements of substrate diffuse into the thin film of oxide superconductor.

In another example of the super-FET according to the present invention, the substrate is doped previously with a dopant which can diffuse easily into the thin film of oxide superconductor and destroy the superconductivity of the oxide superconductor. The dopant have to have such a property that it easily and completely diffuse into the thin film of oxide superconductor Such dopant is preferably a constituent element of the substrate, for example Y, Ba, Cu in the case when the thin film of oxide superconductor is made of oxide of Y—Ba—Cu—O system. In this case, when the thin film of oxide superconductor is deposited on the substrate having the doped zone, a non-superconducting region is formed by diffusion of the dopant from the doped zone into the thin film of oxide superconductor, so that a very thin layer or a portion of superconductor which is left in the thin film of oxide superconductor functions as the superconducting channel. In other words, a very thin superconducting channel is formed in a portion of the thin film of oxide superconductor by upward diffusion from the doped zone. In this sense, the dimension of the doped zone and the concentration of the dopant are very important.

The dimension of the doped zone is less than several μm along the longitudinal direction of the superconducting channel. The doped zone is formed preferably by ion implantation technique at an acceleration energy of lower than 40 keV with a dose of less than $5 \times 10^{14}$ ions/cm$^2$.

When the ion implantation technique which is preferably for forming the doped zone is adopted, the substrate is implanted with ions after a surface of the substrate except the doping zone is covered by a mask, or the doping zone only is implanted with ions by using a converged ion beam. In a variation, after a surface of the substrate except the doping zone is covered by photoresist, a dopant is deposited on the surface of the substrate by vacuum deposition technique so that the doped zone is produced by lift-off technique. Patterning on the order of 0.2 μm of good quality can be effected by the ion implantation technique without using etching step.

In still another example of the superconducting device according to the present invention, a non-superconducting region is formed in the thin film of oxide superconductor by a reaction of an element or elements of which the substrate is made with the oxide superconductor of which the thin film of oxide superconductor is made, so that a portion of superconductor which is left in the thin film of oxide superconductor is used as the superconducting channel. In other words, a very thin superconducting channel is formed in a portion of the thin film of oxide superconductor over the non-superconducting region. In this case, the non-superconducting region is formed in a portion of the thin film of oxide superconductor under the superconducting channel. Therefore, the portion of the thin film of oxide superconductor to be utilized as the superconducting channel is irradiated locally with a light beam by means of a laser unit, a halogen lamp or the like so as to be reacted with a consistent element or elements of the substrate.

In another variation of the superconducting device according to the present invention; the gate electrode is arranged on the superconducting channel through an insulating layer. The superconducting channel is defined or delimited by a non-superconducting region which is produced by diffusion of constituent element(s) of the substrate at its upper limit and/or by a non-superconducting region which is produced by diffusion of constituent element(s) of the gate insulating layer at its lower limit. In this case, the non-superconducting regions are produced by applying an electric current to the gate electrode so as to heat locally the gate insulating layer, the oxide superconductor and the substrate. In practice, the thin film of oxide superconductor is deposited firstly on a substrate and then a gate insulating layer and a gate electrode is formed on the thin film of oxide superconductor. Then, the gate electrode is heated by Joule heat to produce the non-superconducting regions which delimits the superconducting channel. In this case also, it can add a dopant which can easily diffuse into the thin film of oxide superconductor such as Y, Ba or the like on a surface of the substrate. When formation of one of the non-superconducting region by the diffusion from a side of the gate insulator is not desirable by the requirement in dimensions and performance of the superconducting device or the like, an insulating layer made of a material, which hardly diffuse into the thin film of oxide superconductor such as $SrTiO_3$, $BaTiO_3$ or the like is interposed between file thin film of oxide superconductor and the gate insulator.

The substrate on which the thin film of oxide superconductor is S deposited is preferably a single crystalline substrate of oxide such as MgO, $SrTiO_3$, $CdNdAlO_4$ or the like, because a highly orientated crystalline film of oxide superconductor can be grown on these substrates. The substrate may be a semiconductor substrate such as silicon substrate having an insulator layer or buffer layer.

The thin film of oxide superconductor used in the superconducting device according to the present invention can be made of any material including compound oxide superconductors such as Y—Ba—Cu—O system, Bi—Sr—Ca—Cu—O system and Tl—Ba—Ca—Cu—O system.

In the superconducting device according to the present invention, the weak link is not produced by local physical processing or machining in the thin film of oxide superconductor but is produced thermally by local heat-treatment of the thin film of oxide superconductor which change a portion of the thin film to non-superconductor. From this fact, the superconducting device according to the present invention can be manufactured with reduced manufacturing steps and with high productivity without using high precision processing.

In the superconducting device according to the present invention, a current flowing through the superconducting channel is controlled by a voltage applied to the gate formed on the superconducting channel. In other words, the super-FET according to the present invention does not rely on the superconducting proximity effect, so that there is not such critical limitation in the fine processing or work that is requested in the prior art. Still more, the super-FET of this structure require no lamination of superconductor and semiconductor so that a high-performance device can be manufactured from oxide superconductor.

The superconducting device according to the present invention is very suitable for the integrated circuit application because the superconducting device has a planer surface at the finished condition thereof. Therefore, the present invention will widen applications of superconducting technology over a variety of electronics devices.

Now, the present invention will be described with reference to Examples but the scope of the invention should not be limited to the Examples.

DESCRIPTION OF THE PREFERRED EMBODIMENTS

EXAMPLE 1

Figure 1:
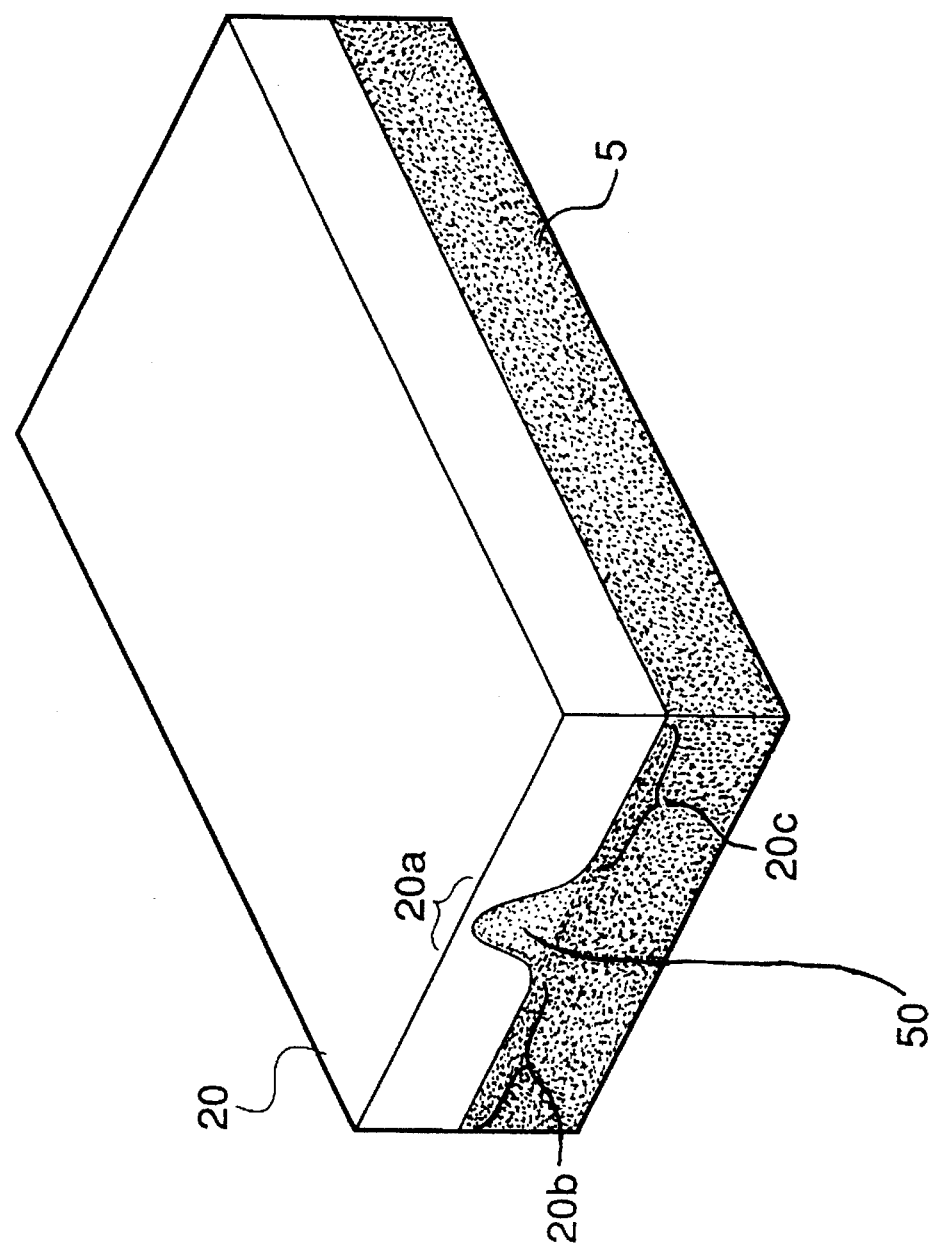
FIG. 1 illustrates the simplest form of a superconducting device according to the present invention.

FIG. 1 illustrates a basic structure of the superconducting device according to the present invention.

The superconducting device of FIG. 1 comprises a thin film layer 20 of oxide superconductor deposited on a substrate 5. In this case, the thin film layer 20 of oxide superconductor has an elongated non-superconducting region. 20a along a center line and a pair of superconducting electrode regions 20b and 20c positioned at opposite sides of the weak link zone 20a.

At the weak link region 20a, a smoothly-curved diffused region 50 is formed by diffusion of constituent element or elements of the substrate 5 into the thin film 20 of oxide superconductor. The diffused region 50 loses its superconductivity due to the diffusion of constituent element or elements of the substrate 5 and an effective wall-thickness of the thin film 20 of oxide superconductor is reduced by the diffused region 50 so that a weak link connecting two superconducting electrode regions 20b and 20c each having a relatively thicker wall thickness is left in the thin film layer 20 of oxide superconductor.

Preparation Example 1

FIGS. 2A to 2D illustrate the steps for manufacturing the superconducting device shown in FIG. 1. In this example, a compound oxide of Y—Ba—Cu—O system is used as the oxide superconductor.

At first, a flat substrate 5 (FIG. 2A) is provided. In this example, MgO (100) substrate is used but other substrates such as CdNdAlO$_4$ (001) can be used advantageously. When such substrate is used, a c-axis orientated thin film which has a large critical current density in a direction in parallel to the substrate surface can be preferably deposited on the substrate 5.

Figure 2A:
FIGS. 2A through 2D illustrates the basic steps for manufacturing a superconducting device according to the present invention.
Figure 2B:
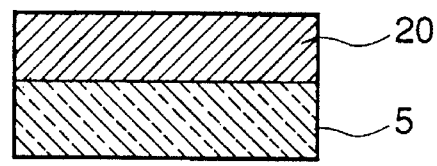

Then, a thin thin film 20 of oxide superconductor is deposited on a substrate 5 as is shown in FIG. 2B. The thin thin film 20 of oxide superconductor must have a wall-thickness which is required to form the final superconducting electrode regions mad can be deposited, for example by an off-axis sputtering or a reactive evaporation. In this example, the thin film 20 of oxide superconductor is prepared by an off-axis sputtering in a sputtering gas of 10 Pa (Ar:O$_2$=9:1) at a substrate temperature of 700° C.

Figure 2C:
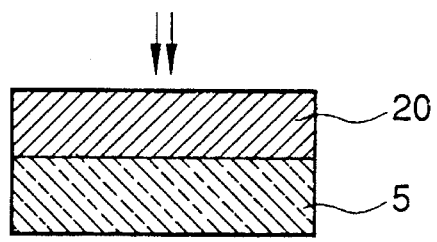

Then, as shown in FIG. 2C by arrows, a laser beam is impinged locally onto the thin film 20 of oxide superconductor at the central portion thereof so that only irradiated region is heated locally. In this example, an argon laser having a wave length of 514 nm is used at a power of 2.0 W. The substrate temperature is lowered below 350° C. A laser beam is focussed by optical means less than 0.5 μm and the laser beam is scanned at a speed of 100 μm/sec.

Figure 2D:
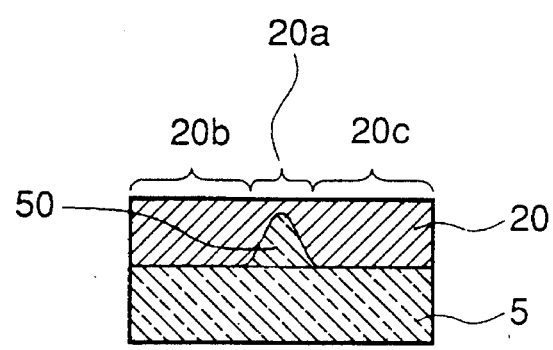

As is shown in FIG. 2D, a diffuse region 50 is produced at a heat-treated region irradiated locally. Since constituent element(s) is diffused into the thin film 20 of oxide superconductor at the smoothly-curving diffused region 50, an effective thickness of the thin film 20 of oxide superconductor is reduced at the the diffused region 50 to a value of about 5 to 10 nm.

Thus, the superconducting device according to the present invention shown in FIG. 1 is completed. Although a laser beam is used in this example, the above-mentioned treatment can be done also by a focussed ion beam.

Preparation Example 2

FIGS. 3A to 3F illustrate another method for manufacturing the superconducting device shown in FIG. 1. In this example, the same compound oxide as the Preparation Example 1 is used. Details of the steps of FIGS. 3A and 3B omitted because they are the same as those of FIG. 2A and 2B.

Figure 3A:
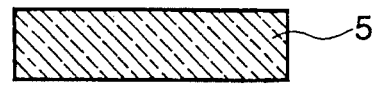
FIGS. 3A through 3F illustrate another basic steps for manufacturing a superconducting device according to the present invention.
Figure 3B:
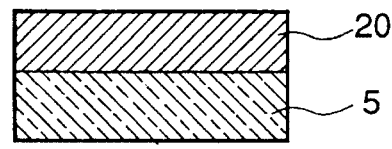
Figure 3C:
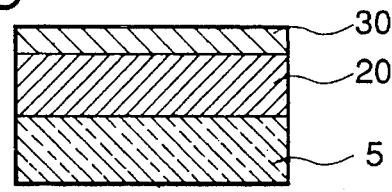
Figure 3D:
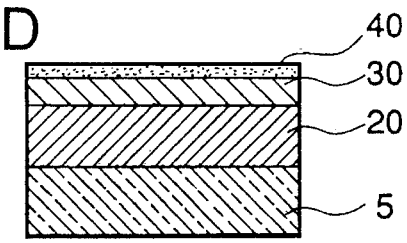

After a thin film 20 of oxide superconductor is deposited on a substrate 5 as is shown in FIG. 3B, the thin film 20 of oxide superconductor is coated with a layer 30 of photoresist for electron beam as is shown in FIG. 3C.

Then, on the photoresist layer 30, a reflective layer 40 which will function as an effective barrier in later stage of lamp-annealing treatment which will be described hereinafter. In practice, the reflective layer 40 is a thin film of metal. In this example, a thin film of Al having a thickness of about 50 nm is deposited by vacuum deposition technique. The photoresist layer 30 has preferably a thickness of about 0.5 to 1.0 μm. Although any photoresist can be used in the present invention if deformation of a pattern of the photoresist caused by heating and by deposition of the reflective layer is prevented, photoresist for electron beam is preferably used.

Figure 3E:
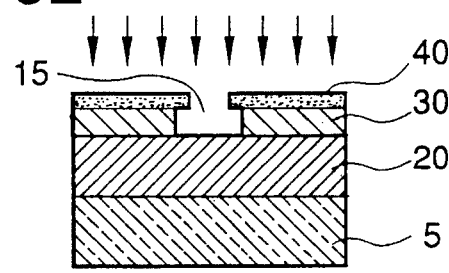
Figure 3F:
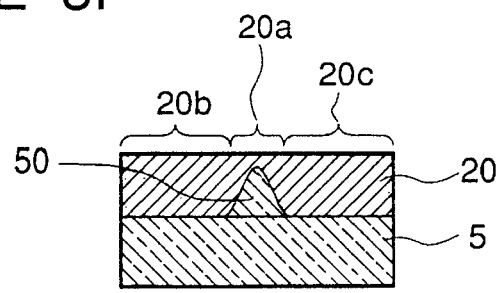
Figure 4A:
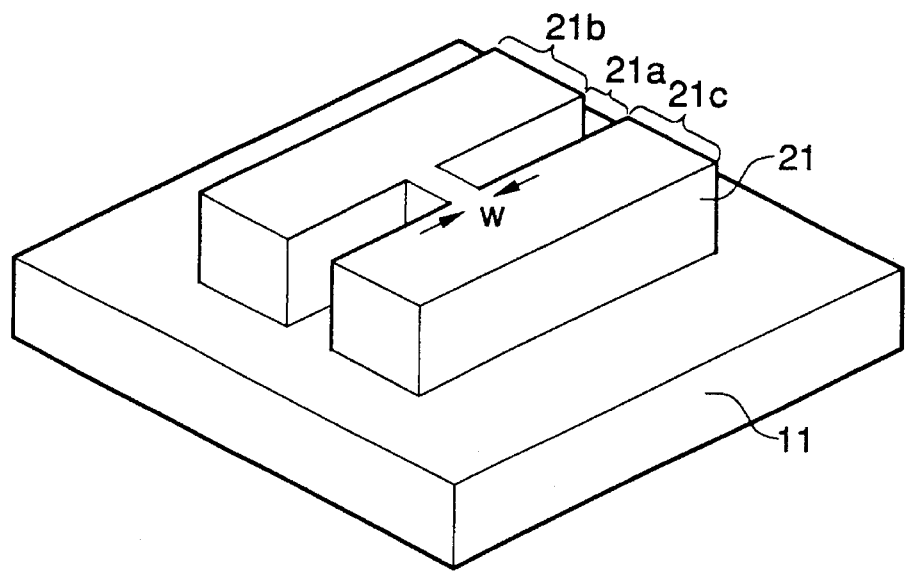
FIG. 4 illustrates two known types of Josephson junctions.
Figure 4B:
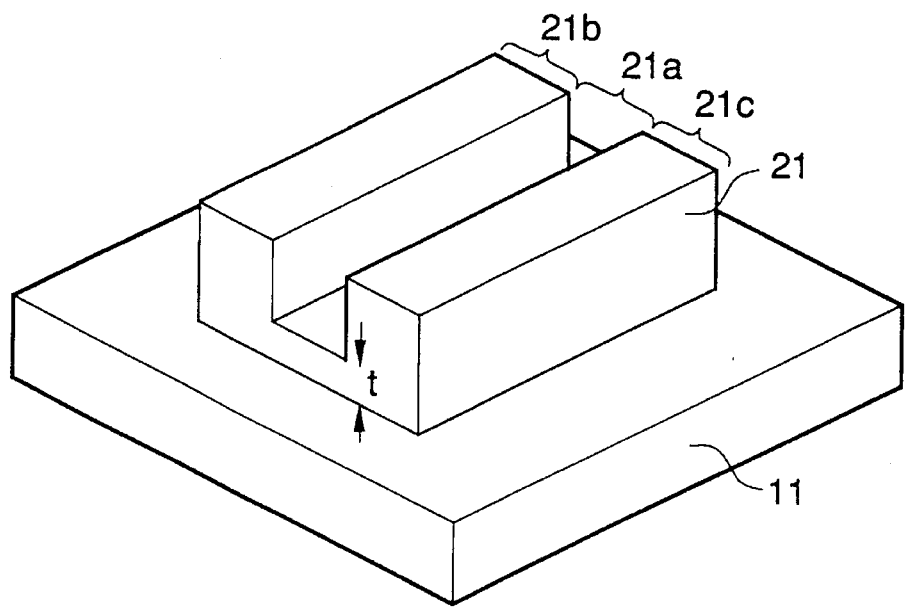
Figure 5:
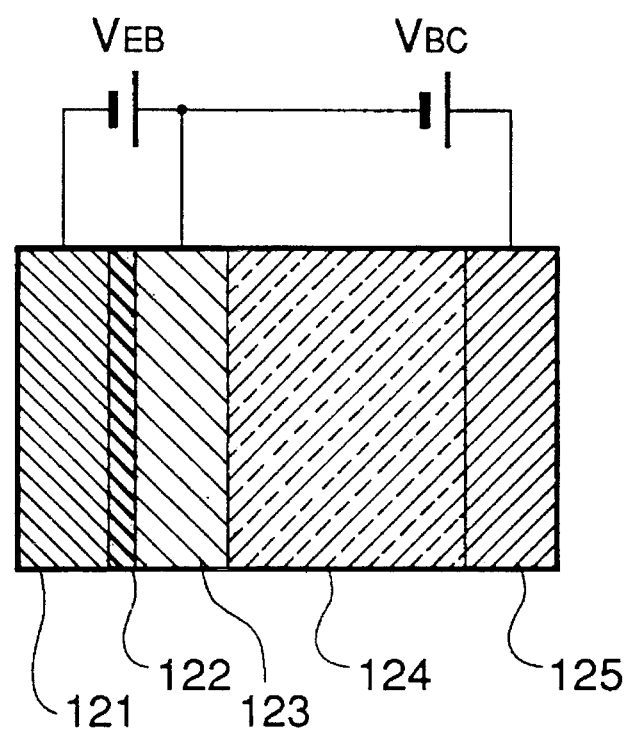
FIG. 5 illustrates the conventional superconducting-base transistor.
Figure 6:
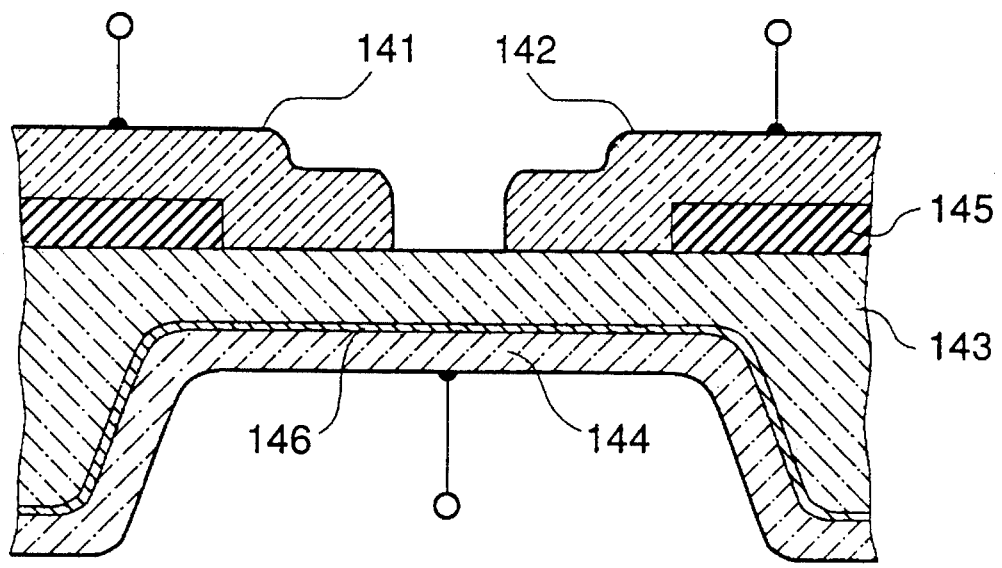
FIG. 6 illustrates the conventional super-Fet.

Then, as shown in FIG. 3E, an opening 15 is formed in the photoresist layer 30 and the reflective layer 40 at a position corresponding to a weak link of a superconducting device. Then, the photoresist layer 30 and the reflective layer 40 are irradiated with an infrared lamp so as to be heated by radiation. In this case, the thin film 20 of oxide superconductor is heated at a region corresponding to the opening 15 by infrared while other regions of the thin film 20 of oxide superconductor covered by the reflective layer 40 are not heated substantially and hence, constituent element(s) of the substrate 5 thermally diffuses gradually into the thin thin film 20 of oxide superconductor to produce a bell-shaped diffusion region 50, as is shown in FIG. 3F. The substrate temperature is maintained at lower than 350° C. during the diffusion. Thus, the superconducting device according to the present shown in FIG. 1 is completed.

EXAMPLE 2

Figure 7:
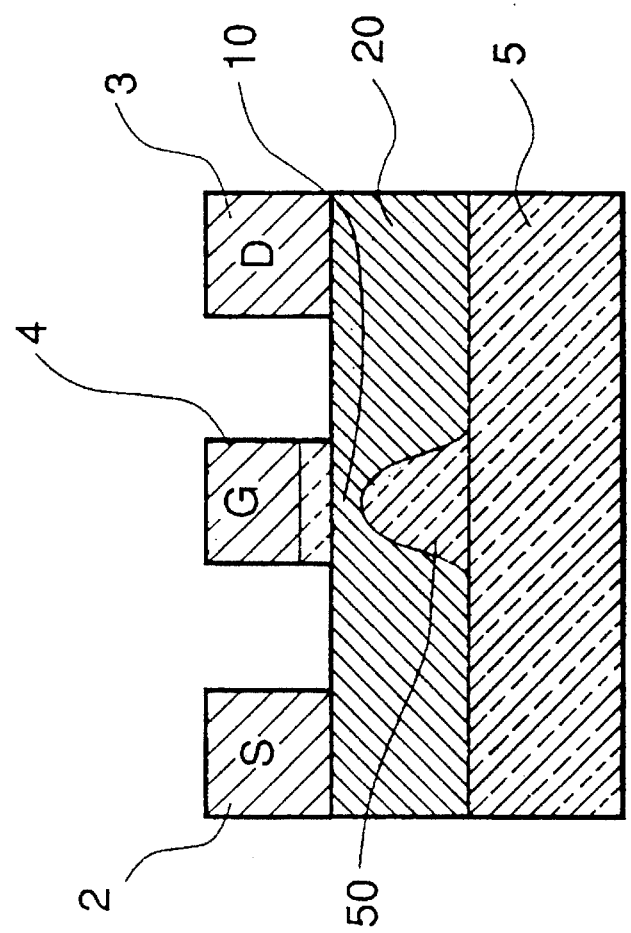
FIG. 7 illustrates an example of the superconducting device according to the present invention.

FIG. 7 is an illustrative cross sectional view of another example of the superconducting device according to the present invention.

The superconducting device of FIG. 7 has a thin film layer 20 of oxide superconductor deposited on a substrate 5. The thin film layer 20 of oxide superconductor has a non-superconducting region 50 which is formed by diffusion of constituent element or elements of the substrate 5 and which loses its superconductivity. An extremely thin superconducting channel 10 of about 5 nanometer (nm) is left in the thin film layer 20 of oxide superconductor over the non-superconducting region 50. A gate electrode 4 is positioned on the superconducting channel 10, while a source electrode 2 and a drain electrode 3 are positioned at opposite sides of the superconducting channel 10.

Figure 8A:
FIGS. 8A through 8F illustrate the steps for manufacturing the superconducting device shown in FIG. 7.
Figure 8B:
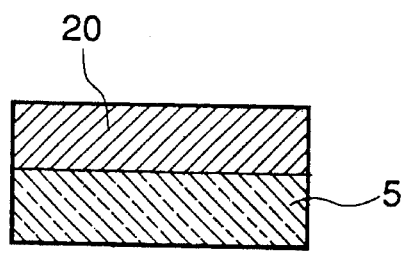

The superconducting device of FIG. 7 is manufactured as following:

At first, an extremely thin film 20 of oxide superconductor is deposited on a substrate 5 shown in FIG. 8A, for example by an off-axis sputtering, a reactive evaporation, an MBE (molecular beam epitaxy), a CVD or the like. The thin film 20 of oxide superconductor has preferably a thickness of 200 to 300 nanometers. The thin film 20 of oxide superconductor is made preferably of compound oxide including Y—Ba—Cu—O system, Bi—Sr—Ca—Cu—O system or Tl—Ba—Ca—Cu—O system and is preferably a c-axis orientated thin film since the c-axis orientated thin film has a large critical current density in the direction in parallel to the substrate surface. The substrate 5 is preferably an insulator substrate such as a MgO (100) substrate and a SrTiO$_3$(100) substrate or a semiconductor substrate such as a silicon having a principal surface coated with for example a laminated insulating layer composed of MgAlO$_4$ and BaTiO$_3$.

Figure 8C:
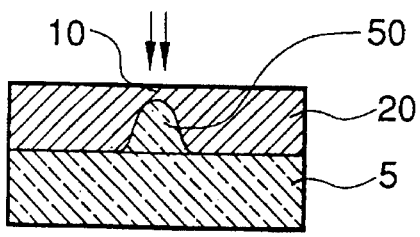

Then, as shown in FIG. 8C by arrows, a laser beam or focussed ion beam is impinged locally onto a predetermined portion of the thin film 20 of oxide superconductor so that constituent element(s) is diffused into the thin film 20 of oxide superconductor to produce a non-superconducting region 50 while a superconducting channel 10 is left over the non-superconducting region 50.

When the non-superconducting region is formed by irradiation of a laser beam, a high-energy laser such as an eximer laser, a carbon dioxide gas laser and a YAG laser can be used preferably. For example, an argon laser having a wave length of 514 nm is preferably scanned at a speed of 100 μm/sec and a power of 2.0 W. When the non-superconducting region is formed by irradiation of a focussed ion beam, an argon ion beam having a beam diameter of less than 0.2 μm is preferably used at an acceleration energy of lower than 50 keV.

Figure 8D:
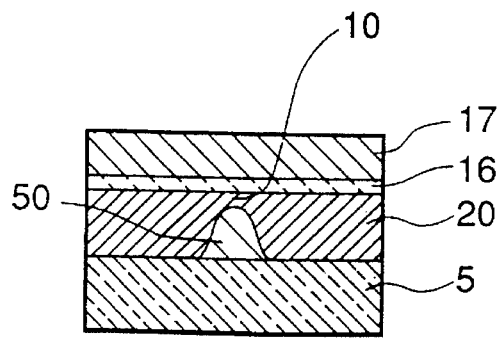

Then, a gate electrode is formed on the superconducting channel 10. The gate electrode has preferably a laminated structure consisting of an insulating layer 16 deposited on the thin film of oxide superconductor and a metal layer 17 deposited on the insulating layer 16 as is shown in FIG. 8D. The insulating layer 16 is preferably made of insulating material such as MgO Which does not form a large density of energy levels at an interface between the thin film 20 of oxide superconductor and the insulating layer 1.6 and has preferably a thickness of not less than ten nanometers. The metal layer 17 is preferably made of Au or a metal having a high melting point such as Ti and W or a silicide thereof.

Figure 8E:
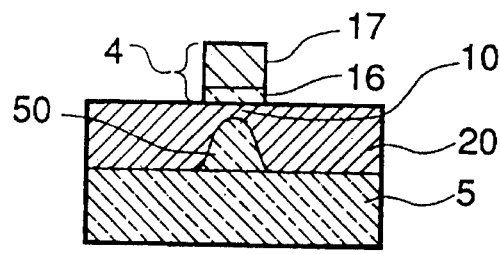
Figure 8F:
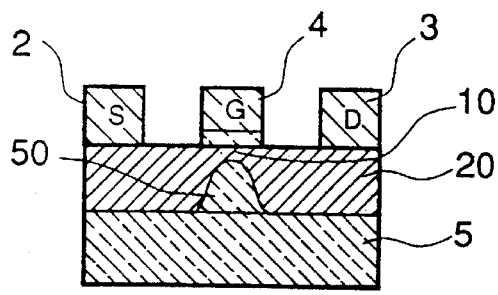

Thereafter, as is shown in FIG. 8E, the stacked layers of the insulating layer 16 and the metal layer 17 are selectively removed by etching so as to leave a gate electrode 4 over the superconducting channel 10.

Finally, as shown in FIG. 8E, a source electrode 2 and a drain electrode 3 of a metal which is the same material as is used in the gate electrode 4 are formed on the thin film 20 of oxide superconductor at opposite sides of the gate electrode 4 respectively to complete the superconducting device in accordance with the present invention.

As explained above, the limitation in the fine processing or work which is required for manufacturing the super-FET is relaxed when the super-FET is manufactured by the method according to the present invention. Still more, wiring which may be effected in the later stage for an integrated circuit application is facilitated because an upper surface of the superconducting device is flat. And, it is easy to manufacture the super-FET with high repeatability and with stable performance.

EXAMPLE 3

Figure 9:
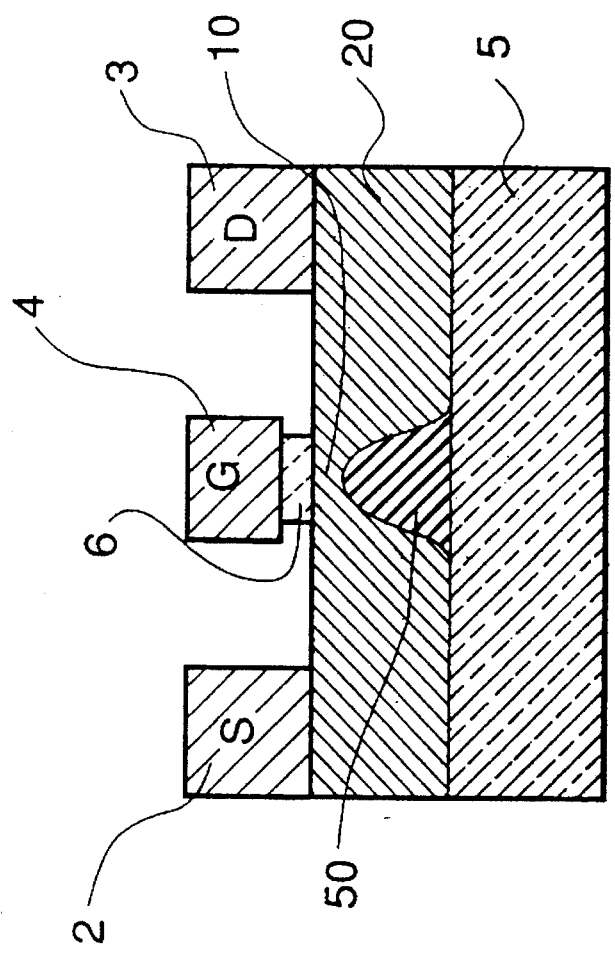
FIG. 9 illustrates another example of the superconducting device according to the present invention.

FIG. 9 is an illustrative cross sectional view of still another example of the superconducting device according to the present invention.

The superconducting device of FIG. 9 has a thin film layer 20 of oxide superconductor deposited on a substrate 5. The thin film layer 20 of oxide superconductor has a non-superconducting zone 50 which is formed by a reaction of constituent element or elements of the substrate 5 with the oxide superconductor and which loses its superconductivity. An extremely thin superconducting channel 10 of about 5 nanometer (nm) is left in the thin film layer 20 of oxide superconductor over the non-superconducting region 50. A gate electrode 4 is deposited on an insulating layer 1.6 deposited on the superconducting channel. 10, while a source electrode 2 and a drain electrode 3 are positioned at opposite sides of the superconducting channel 10.

Figure 10A:
FIGS. 10A through 10I illustrate the steps for manufacturing the superconducting device shown in FIG. 9.
Figure 10B:
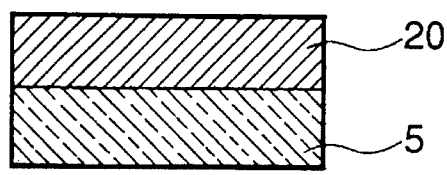

The superconducting device of FIG. 9 is manufactured as following:

At first, an extremely thin film 20 of oxide superconductor is deposited on a substrate 5 shown in FIG. 10A, for example by an off-axis sputtering, a reactive evaporation, an MBE (molecular beam epitaxy), a CVD (chemical vapour deposition) or the like as is shown in FIG. 10B. The thin film 20 of oxide superconductor has preferably a thickness of 200 to 300 nanometers. The thin film 20 of oxide superconductor is made preferably of compound oxide including Y—Ba—Cu—O system, Bi—Sr—Ca—Cu—O system or T1—Ba—Ca—Cu—O system and is preferably a c-axis orientated thin film since the c-axis orientated thin film has a large critical current density in the direction in parallel to the substrate surface. The substrate 5 is preferably an insulator substrate such as a MgO (100) substrate and a SrTiO$_3$ (100) substrate or a semiconductor substrate such as a silicon having a principal surface coated with for example a laminated insulating layer composed of MgAlO$_4$ and BaTiO$_3$.

Figure 10C:
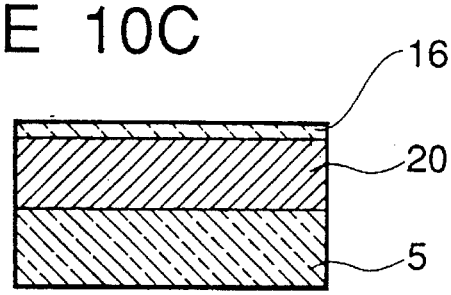

Then, as shown in FIG. 10C, an insulating layer 16 is deposited on the thin film 20 of oxide superconductor. The insulating layer 16 is deposited to have a thickness of not less than ten nanometers which is sufficient to prevent a tunnel current. The insulating layer 16 is formed of an insulating material such as MgO, which does not form a large density of energy levels between the thin film 20 of oxide superconductor and the insulating layer 16. In order to reduce mechanical stress, it is preferred to form the insulating layer 16 having similar composition to that of oxide superconductor of the thin film 20 on the thin film 20 of the oxide superconductor without taking out the substrate 5 out of a film-forming apparatus or chamber after the oxide superconductor thin film 20 is deposited on the substrate 5.

Figure 10D:
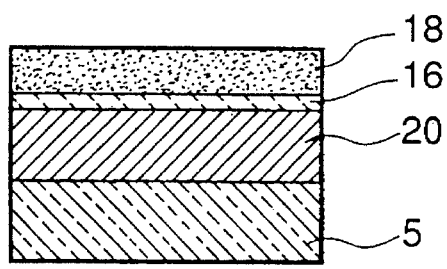
Figure 10E:
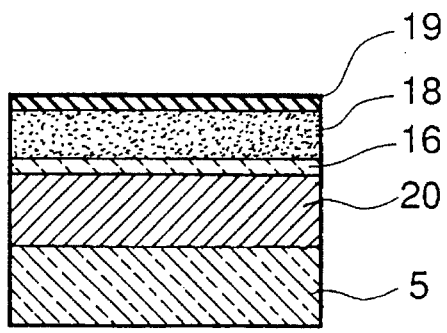
Figure 10F:
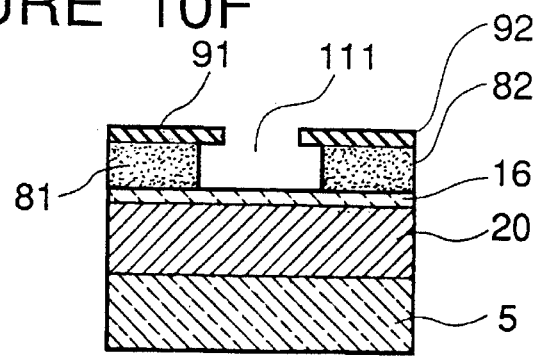

Then, as is shown in FIG. 10D, a photoresist layer 18 is formed on the insulating layer 16 and a reflective layer 19 of Al is deposited. Then, as is shown in FIG. 10E, the reflective layer 19 and the photoresist layer 18 are selectively removed by etching to divide them into reflective layers 91, 92 and photoresist layers 81, 82 and to expose the insulating layer 16 at an opening 111, as shown in FIG. 10F.

Figure 10G:
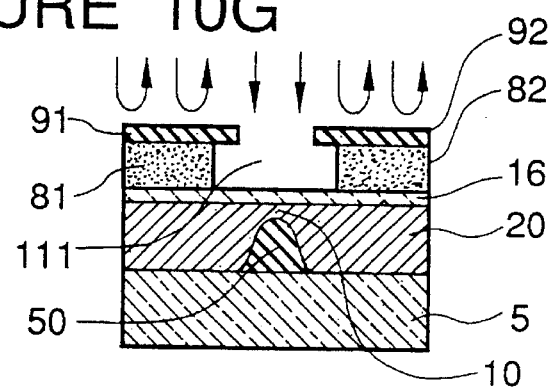

Then, as is shown in FIG. 10G, a laser beam is impinged onto the resulting assembly to react the oxide superconductor with the substrate under the opening 111 so as to produce a non-superconducting region 50. This reaction may be effected by lamp annealing. In this case, the time duration of irradiation and a temperature of irradiated region are adjusted in such a manner that a superconducting region having a thickness of about 5 nm is left over the non-superconducting region 50.

Figure 10H:
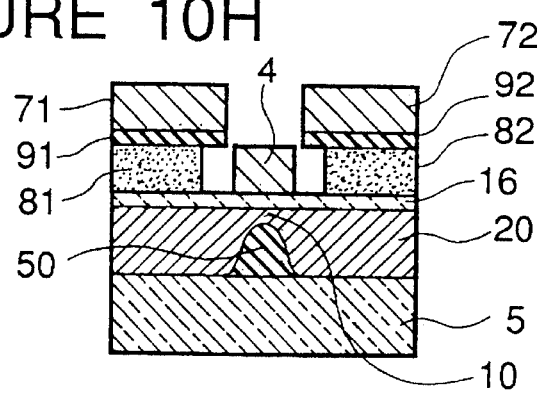

After the non-superconducting region 50 is formed, a surface of the insulating layer 16 exposed to the opening 111 is cleaned and, as shown in FIG. 10H, a gate electrode 4 of Au or a metal having a high melting point such as Ti and W or a silicide thereof is deposited by evaporation technique. Metal layers 71, 72 deposited on the reflective layers 91, 92 are remove together with the photoresist layers 81, 82.

Figure 10I:
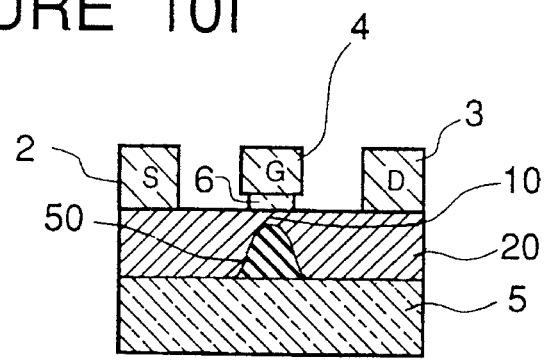

Finally, as shown in FIG. 10I, the insulating layer 16 is selectively etched in a self alignment to the patterned gate electrode 4, so that an gate insulator 16 is left on the thin film 20 of oxide superconductor only under the patterned gate electrode 4. In this connection, it is desired that the gate insulator 16 is side-etched in comparison with the gate electrode 4, so that the gate insulator 16 has a length shorter than that of the gate electrode 4. Finally, a source electrode 2 and a drain electrode are formed at opposite sides of the gate electrode 4 to complete the superconducting device according to the present invention.

As explained above, the limitation in the fine processing or work which is required in the prior arts for manufacturing the super-FET is relaxed when the super-FET is manufactured by the method according to the present invention. Still more, wiring which may be effected in the later stage for a integrated circuit application is facilitated because an upper surface of the superconducting device is flat. In addition, it is easy to manufacture the super-FET with high repeatability and with stable performance.

EXAMPLE 4

Figure 11:
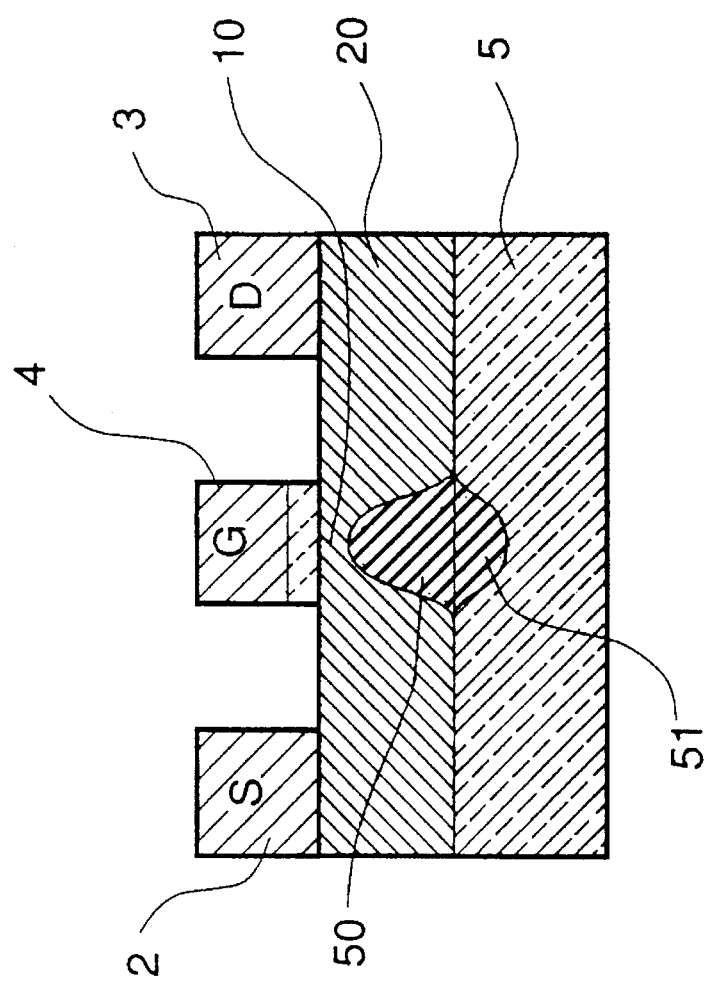
FIG. 11 illustrates still another example of the superconducting device according to the present invention.

FIG. 11 is an illustrative cross sectional view of still another example of the superconducting device according to the present invention.

The superconducting device of FIG. 11 has a thin film layer 20 of oxide superconductor deposited on a substrate 5. The thin film layer 20 of oxide superconductor has a non-superconducting region 50 which is formed by diffusion of a dopant which has been doped previously into the substrate 5 and which loses its superconductivity. An extremely thin superconducting channel 10 of about 5 nanometer (nm) is left in the thin film layer 20 of oxide superconductor over the non-superconducting region 50. A gate electrode 4 is positioned on the superconducting channel 10, while a source electrode 2 and a drain electrode 3 are positioned at opposite sides of the superconducting channel 10.

Figure 12A:
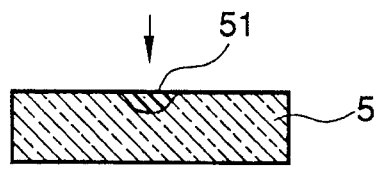
FIGS. 12A through 12E illustrates successive steps for manufacturing the superconducting device shown in FIG. 11.

The superconducting device of FIG. 11 is manufactured as following:

At first, as shown in FIG. 12A by an arrow, a focussed ion beam is impinged locally onto a predetermined portion of the substrate 5 to produce a doped region 51. The substrate 5 is preferably an insulator substrate such as a MgO (100) substrate and a $SrTiO_3$(100) substrate or a semiconductor substrate such as a silicon substrate having a principal surface coated with for example a laminated insulating layer composed of $MgAlO_4$ and $BaTiO_3$.

The ions to be ion implanted are preferably ions of Ba, Y and Cu and have preferably a beam diameter of 0.2 µm and an acceleration energy of 50 keV. When a focussed ion beam of these elements is used, a doped region 51 having a width of less than 1 µm can be formed on a surface of the substrate 5.

Figure 12B:
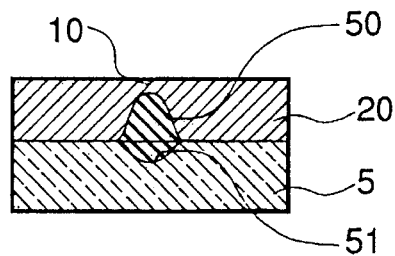

Then, a thin film 20 of oxide superconductor is deposited on a substram 5 having the doped region 51 as is shown in FIG. 12B, for example by an off-axis sputtering, a reactive evaporation, an MBE (molecular beam epitaxy), a CVD (chemical vapour deposition) or the like. The thin thin film 20 of oxide superconductor has preferably a thickness of 200 to 300 nanometers. During the thin film 20 of the oxide superconductor is produced, the dopant diffuse from the doped zone 51 into the thin 20 of oxide superconductor to form a non-superconducting region 50 and a superconducting channel 10 is left over the non-superconducting region 50 of the thin film 20 of the oxide superconductor.

The thin thin film 20 of oxide superconductor is made preferably of compound oxide including Y—Ba—Cu—O system, Bi—Sr—Ca—Cu—O system or Tl—Ba—Ca—Cu—O system and is preferably a c-axis orientated thin film since the c-axis orientated thin film has a large critical current density in the direction in parallel to the substrate surface.

Figure 12C:
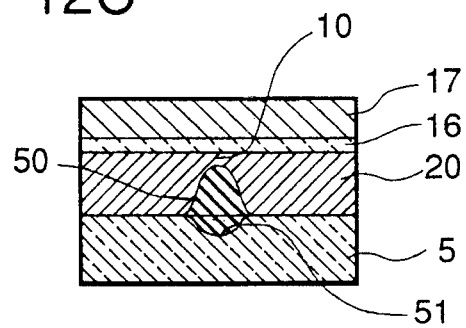

Then, a gate electrode layer is formed on the superconducting channel 10 as is shown in FIG. 12C. The gate electrode layer has preferably a laminated structure consisting of an insulating layer 16 deposited on the thin film of oxide superconductor and a metal layer 17 deposited on the insulating layer 16. The insulating layer 1.6 is preferably made of insulating material such as MgO which do not form a large density of energy levels at an interface between the thin film 20 of oxide superconductor and the insulating layer 16 and has preferably a thickness of not less than ten nanometers. The metal layer 17 is preferably made of Au or a metal having a high melting point such as Ti and W or a silicide thereof.

Figure 12D:
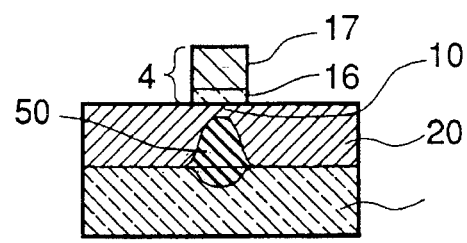

Thereafter, as is shown in FIG. 12D, the stacked layers of the insulating layer 6 and the metal layer 17 re selectively removed by etching so as to leave a gate electrode 4 over the superconducting channel 10.

Figure 12E:
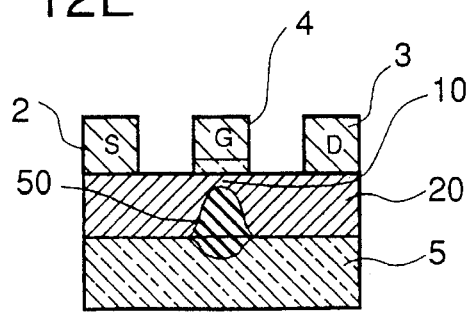

Finally, as shown in FIG. 12E, a source electrode 2 and a drain electrode 3 made of the same metal as is used in the gate electrode 4 are formed on the thin film 20 of oxide superconductor at opposite sides of the gate electrode 4 respectively to complete the superconducting device in accordance with the present invention.

As explained above, the limitation in the fine processing or work which is required for manufacturing the super-FET is relaxed when the super-FET is manufactured by the method according to the present invention. Still more, wiring which may be effected in the later stage for an integrated circuit application is facilitated because an upper surface of the superconducting device is flat. In addition, it is easy to manufacture the super-FET with high repeatability and with stable performance.

EXAMPLE 5

Figure 13:
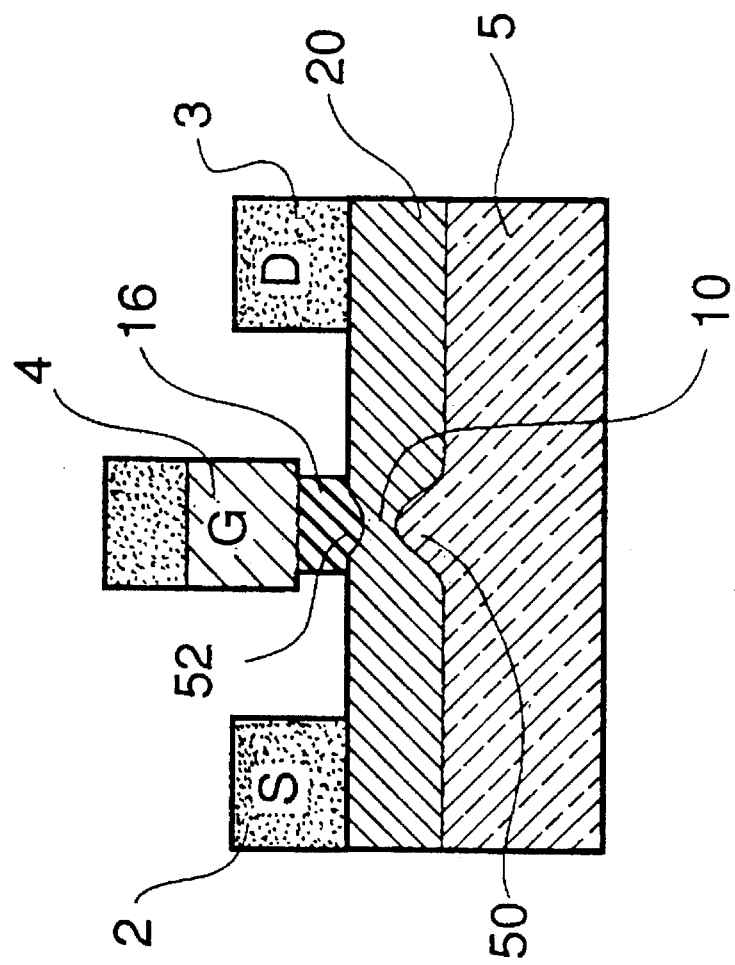
FIG. 13 illustrates still another example of the superconducting device according to the present invention.

FIG. 13 is an illustrative cross sectional view of still another example of the superconducting device according to the present invention.

The superconducting device of FIG. 13 has a thin film layer 20 of oxide superconductor deposited on a substrate 5. On the thin film layer 20 of oxide superconductor, a source electrode 2 and a drain electrode 3 are positioned at opposite sides and a gate electrode 4 is positioned at the near center. The gate electrode 4 is deposited on a gate insulating layer 16. Under the gate insulating layer 16, there are two non-superconducting regions comprising a non-superconducting region 52 which is produced by the diffusion of constituent element(s) of a gate insulating layer 16 and a non-superconducting region, 50 which is produced by the diffusion of constituent element(s) of the substrate 5. A superconducting channel 10 having a thickness of about 5 nm is delimited by these two non-superconducting regions 50,52.

Figure 14A:
FIGS. 14A through 14E illustrate successive steps for manufacturing the superconducting device shown in FIG. 13.
Figure 14B:
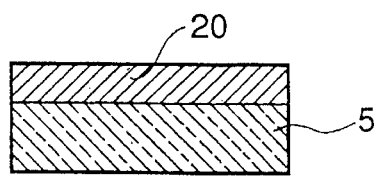

The superconducting device of FIG. 13 is manufactured as following:

At first, a thin film 20 of oxide superconductor is deposited on a substrate 5 shown in FIG. 14A, for example by an off-axis sputtering, a reactive evaporation, an MBE (molecular beam epitaxy), a CVD (chemical vapour deposition) or the like, as shown in FIG. 14B. The thin film 20 of oxide superconductor has preferably a thickness of about 200 nanometers. The thin film 20 of oxide superconductor is made preferably of compound oxide including Y—Ba—Cu—O system, Bi—Sr—Ca—Cu—O system or Tl—Ba—Ca—Cu—O system and is preferably a c-axis orientated thin film since the c-axis orientated thin film has a large critical current density in the direction in parallel to the substrate surface. Film forming conditions by the off-axis sputtering are as following:

| Sputtering gas | Ar: 90% |
| | $O_2$ 10% |
| Pressure | 10 Pa |
| Substrate temperature | 700° C. |

The substrate 5 is preferably an insulator substrate such as a MgO (100) substrate and a $SrTiO_3$(100) substrate or a semiconductor substrate such as a silicon having a principal surface coated with for example a laminated insulating layer composed of $MgAlO_4$ and $BaTiO_3$.

Figure 14C:
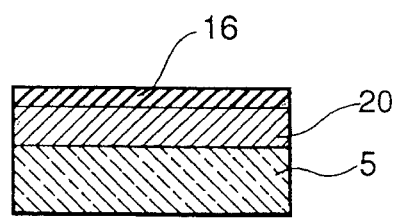
Figure 14D:
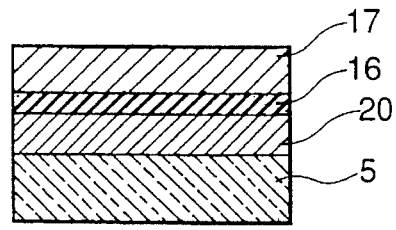

Then, as is shown in FIG. 14C; an insulating layer 16 having a thickness of not less than 10 nm is deposited on the thin film 20 of oxide superconductor. The insulating layer 16 is preferably made of insulating material such as MgO which does not form a large density of energy levels at an interface between the thin film 20 of oxide superconductor and the insulating layer 16. Then, as is shown in FIG. 14D, a metal layer 17 is deposited on the insulating layer 16. The metal layer 17 is preferably made of Au or a metal having a high melting point such as Ti or Mo.

Figure 14E:
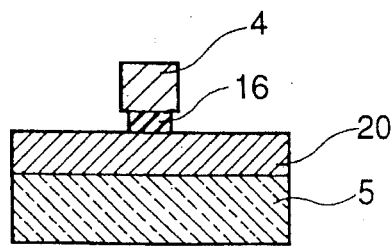
Figure 14F:
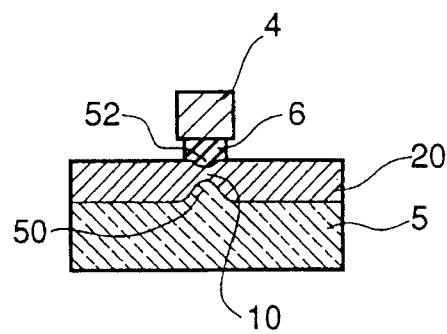

Thereafter, as is shown in FIG. 14E, the resulting stacked layers of the insulating layer 16 and the metal layer 17 are selectively removed by an anisotropic etching such as reactive ion etching or Ar-etching so as to form a gate electrode 4 and a gate insulating layer 16. In this connection, it is desired that the gate insulator 16 is side-etched in comparison with the gate metal 17, so that the gate insulator 16 has a length shorter than that of the gate metal 17.

After the gate electrode 4 and the gate insulating layer 16 are formed, an electric current is applied to the gate electrode 4 so as to heat locally the gate insulating layer 16, the thin film 20 of oxide superconductor and the substrate 5. During this heating, temperature is adjusted in such a manner that the highest temperature among the gate insulating layer 16, the thin film 20 of oxide superconductor and the substrate 5 become not lower than 600° C. but is not higher than 700° C. The substrate 5 may be heated if necessary.

Due to this heating, constituent elements of the substrate 5 and of the gate insulating layer 16 diffuse into the thin film of oxide superconductor to produce respective non-superconducting regions 50, 52 and hence a superconducting channel 10 is delimited in the thin film 20 of oxide superconductor. In other words, in the method according to the present invention, the superconducting channel 10 is formed spontaneously under the gate electrode 4.

In order to accelerate the diffusion from the substrate side 5, a dopant which can diffuse easily into the thin film 20 of oxide superconductor can be deposited on a surface of the substrate 5. And, if formation of one of the non-superconducting zone by the diffusion from the side of the gate insulator 16 is not desirable, an insulating layer made of a material which difficulty diffuse into the thin film of oxide superconductor such as $SrTiO_3$, $BaTiO_3$ or the like is interposed between the thin film 20 of oxide superconductor and the gate insulator 16.

Figure 14G:
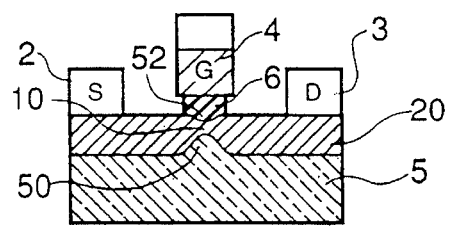

Finally, as shown in FIG. 14G, a source electrode 2 and a drain electrode 3 of high-melting point metal such as Au, Ti and W or their silicides are deposited at opposite sides of the gate electrode 4 to complete a superconducting device according to the present invention.

As explained above, the limitation in the fine processing or work which is required for manufacturing the super-FET is relaxed when the super-FET is manufactured by the method according to the present invention. Still more, the superconducting channel is assured in a part of the thin film 20 of oxide superconductor where superconductivity is not spoiled or deteriorated caused by the interaction between the thin film of oxide superconductor and the gate insulating layer or the substrate. In addition, a thickness of the superconducting channel can be adjusted by controlling the time duration of heating. In conclusion, the superconducting device according to the present invention is easy to be manufactured and is stable in its performance with high repeatability.

We claim:

1. A superconducting device comprising:
    a substrate having a diffusable element therein, said diffusable element being diffusable from said substrate,
    a pair of superconducting electrode regions formed by a thin film of oxide superconductor having a sufficiently thick wall-thickness on said substrate, and
    a weak link region,
    said superconducting electrode regions being positioned at opposite sides of said weak link region,
    said superconducting electrode regions and said weak link region being formed on a common plane surface of said substrate, and
    said weak link region comprising a diffusion region and a superconducting region, said diffusion region being non-superconducting and including a portion of said element from said substrate and a first portion of said thin film of oxide superconductor which contains said portion of said diffusion element therein, said superconducting region including a second portion of said thin film of oxide superconductor which corresponds to said weak link region, said second portion having a thickness from said diffusion region to an upper surface of said thin film for forming a superconducting channel in said thin film of oxide superconductor over said non-superconducting diffusion region,
    said diffusion region being formed by irradiating said thin film of oxide superconductor, at said weak link region, with a laser beam having a predetermined intensity at a predetermined wavelength,
    said diffusion region thereby having a profile including, in a direction substantially perpendicular to said substrate, a curved uppermost section located beneath said superconducting region and opposing curved side sections that each curve outwardly and downwardly away from said uppermost section toward said substrate.

2. The superconducting device set forth in claim 1 wherein a source electrode and a drain electrode for supplying a superconducting current which passes through said superconducting channel are deposited on said thin film of oxide superconductor on said superconducting electrode regions at opposite sides of said superconducting channel, and a gate electrode for controlling said superconducting current is positioned over said superconducting channel.

3. The superconducting device set forth in claim 2 wherein an insulating layer is further interposed between said gate electrode and said superconducting channel.

4. The superconducting device set forth in claim 1 wherein said diffusable element is a dopant which can be diffused easily into said thin film of oxide superconductor to destroy the superconductivity of said oxide superconductor and which is disposable onto a surface of said thin film of oxide superconductor.

5. The superconducting device set forth in claim 1 wherein said non-superconducting diffusion region is formed by a reaction between said element and said oxide superconductor.

6. The superconducting device set forth in claim 3 wherein another non superconducting region is formed between said insulating layer and said superconducting channel by diffusion of an element from said insulating layer.

7. The superconducting device set forth in claim 1, wherein said laser beam has a wavelength of 514 nm at a power of 2.0w, wherein said beam is focussed to less than 0.5 μm, and wherein said beam is scanned at a speed of 100 μm/sec.

8. The superconducting device set forth in claim 7, wherein while said diffusion region is being irradiated by said laser beam, said substrate temperature is below 350° C.

9. A superconducting device comprising:
    a substrate having a diffusable element therein, said diffusable element being diffusable from said substrate,
    a pair of superconducting electrode regions formed by a thin film of oxide superconductor having a sufficiently thick wall-thickness on said substrate, a weak link region, and a gate insulating layer on said weak link region, said superconducting electrode regions being positioned at opposite sides of said weak link region, said superconducting electrode regions and said weak link region being formed on a common plane surface of said substrate, and said weak link region comprising a diffusion region and a superconducting region, said diffusion region being non-superconducting and including a portion of said element from said substrate and a first portion of said thin film of oxide superconductor which contains said portion of said diffusable element therein, said superconducting region including a second portion of said thin film of oxide superconductor which corresponds to said weak link region, said second portion having a thickness from said diffusion region to an upper surface of said thin film for forming a superconducting channel in said thin film of oxide superconductor over said non-superconducting diffusion region, said diffusion region being formed by heating said thin film of oxide superconductor, at said weak link region, whereby, among said gate insulating layer, said thin film of oxide superconductor, and said substrate, the highest temperature thereamong is not less than 600° C. and not more than 700° C., said diffusion region thereby having a profile including, in a direction substantially perpendicular to said substrate, a curved uppermost section located beneath said superconducting region and opposing curved side sections that each curve outwardly and downwardly away from said uppermost section toward said substrate.

10. The superconducting device set forth in claim 9 wherein a source electrode and a drain electrode, for supplying a superconducting current which passes through said superconducting channel, are deposited on said thin film of oxide superconductor on said superconducting electrode regions at opposite sides of said superconducting channel, and a gate electrode for controlling said superconducting current is positioned over said gate insulating layer.

11. The superconducting device set forth in claim 9 wherein said diffusable element is a dopant which can diffuse easily into said thin film of oxide superconductor to destroy the superconductivity of said oxide superconductor and which is disposable onto a surface of said thin film of oxide superconductor.

12. The superconducting device set forth in claim 11 wherein another non-superconducting region is formed between said gate insulating layer and said superconducting channel by diffusion of an element from said gate insulating layer.

* * * * *